United States Patent [19]
Gontowski, Jr. et al.

[11] Patent Number: 4,670,721
[45] Date of Patent: Jun. 2, 1987

[54] RELAXATION OSCILLATOR INTEGRATED CIRCUIT HAVING SHORTABLE ZENER DIODES FOR ADJUSTING DISCHARGE CURRENT

[75] Inventors: Walter S. Gontowski, Jr., Thompson, Conn.; John G. Metro, North Kingstown; Steven S. Yole, West Warwick, both of R.I.

[73] Assignee: Cherry Semiconductor Corporation, E. Greenwich, R.I.

[21] Appl. No.: 842,443

[22] Filed: Mar. 21, 1986

[51] Int. Cl.$^4$ ............................................... H03B 5/24
[52] U.S. Cl. .................................. 331/44; 331/108 D; 331/111; 331/179
[58] Field of Search ............... 331/111, 108 C, 108 D, 331/143, 44, 179

[56] References Cited
U.S. PATENT DOCUMENTS

| | | | |
|---|---|---|---|
| 4,131,884 | 12/1978 | Comer | 340/347 CC |
| 4,225,878 | 9/1980 | Dobkin | 357/51 |
| 4,450,415 | 5/1984 | Gontowski, Jr. | 331/111 |
| 4,494,088 | 1/1985 | Gontowski, Jr. et al. | 331/111 |

Primary Examiner—Siegfried H. Grimm
Attorney, Agent, or Firm—Robert M. Asher

[57] ABSTRACT

An oscillator integrated circuit is disclosed in which a predetermined current is reliably established through a discharge transistor by zener zapping appropriate circuit components. In accordance with an embodiment, a plurality of zener diodes are provided in parallel with a plurality of resistors and one or more is shorted out to achieve a predetermined discharge current. In accordance with a second embodiment, the multiplication factor of the discharge transistor is set by trimming its emitters through zener zapping to obtain a predetermined discharge current.

13 Claims, 4 Drawing Figures

RELAXATION OSCILLATOR INTEGRATED CIRCUIT HAVING SHORTABLE ZENER DIODES FOR ADJUSTING DISCHARGE CURRENT

BACKGROUND OF THE INVENTION

The present invention is directed to power supply control integrated circuits with a maximum duty cycle clamp.

Pulse-width modulated control integrated circuits for use in switched/mode power supplies contain a myriad of functions including an oscillator, error amp, voltage reference, pulse width modulator, protection circuitry and output stage. In some instances, two functions may be served by one circuit block to minimize pin count and external circuitry.

The present invention serves the functions of clock oscillator and maximum duty cycle clamp. The oscillator is required to set up the basic switching frequency of a power supply. A maximum duty cycle clamp limits the percentage duty cycle or time ON relative to time OFF of the switching element to a pre-set maximum.

FIG. 1 is a simplified block diagram of a circuit that combines the functions of clock oscillator and maximum duty cycle control. The charging resistor 10 charges the timing capacitor 12 towards its top voltage $V_t$. During this time period, the output 14 is enabled and under normal operation would remain on, supplying power to the load as required to maintain the proper output voltage. When the timing capacitor 12 reaches a voltage of $V_t$, a comparator 16 closes switch 18 causing the discharge resistor 20 to start discharging the timing capacitor 12. The switch 18 simultaneously disables the output stage 14. The percentage of ON time is determined by selecting the timing components capacitor 12, resistor 10 and discharge resistor 20.

An integrated circuit is generally manufactured on a silicon chip. Manufacturing tolerance of the components in an oscillator integrated circuit generally produce a widely varying discharge current from one integrated circuit to the next. Thus, the prior art circuitry suffers from accuracy problems. These are most pronounced when used in a 50% maximum duty cycle configuration. In this mode of operation, the matching of the charging current to the discharge current is critical for both frequency and maximum duty cycle. The oscillator circuit is generally provided in a separate package from the charging resistor and charging capacitor. An external charging resistor can be provided with a very narrow tolerance. However, the internal discharging resistor in an integrated circuit generally has a tolerance of plus or minus 30% and a temperature coefficient of 2,000 parts per million. As such, these prior art oscillator circuits cannot be used to mass manufacture circuits requiring an accurate 50% maximum duty cycle configuration. A different charging resistor may be needed for each oscillator integrated circuit depending upon the precise value of the discharging resistor.

Limiting the maximum duty cycle is a very important factor in pulse width modulation when the output is used to drive an inductor since the time ON must be carefully controlled to prevent core saturation and subsequent catastrophic failure modes. Therefore, it is an object of the present invention to provide an oscillator integrated circuit which can be used repeatably in mass manufacture in combination with a single matching charging resistor value so as to produce a 50% maximum duty cycle configuration.

SUMMARY OF THE INVENTION

The present invention is directed to an oscillator integrated circuit having a series of resistors and a plurality of zener diodes each diode being located in parallel with one of said resistors from said series of resistors. One or more of the zener diodes is shorted out so that said oscillator integrated circuit is provided with a discharge resistance that results in a predetermined discharge current. The integrated circuit of the present invention may also include circuitry for compensating for changes in temperature yet maintaining the predetermined discharge current.

In an alternative embodiment of the invention zener zapping may be used to trim emitters from the discharge transistor to change its current multiplication factor. The adjustment of the multiplication factor achieves a predetermined discharge current.

Advantageously, oscillator integrated circuits of the present invention may be reliably used in a manufacturing environment with a known charging resistor to provide circuits that reliably achieve a 50% maximum duty cycle configuration.

Other objects and advantages of the invention will become apparent during the following description of the presently preferred embodiments of the invention taken in conjunction with the drawings.

DETAILED DESCRIPTION OF THE PREFERRED EMBODIMENTS

Figure 1:
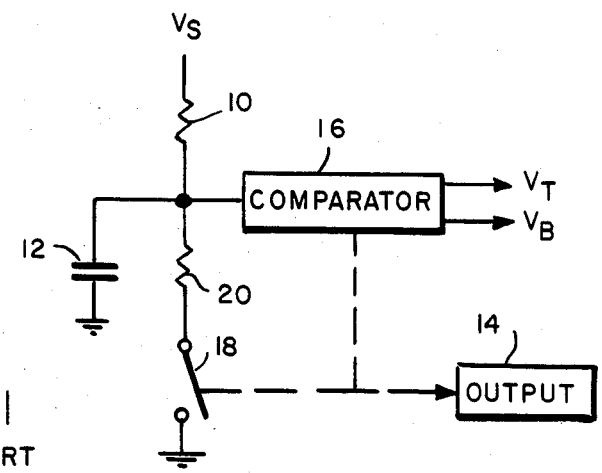
FIG. 1 is a basic schematic of an oscillator circuit as is known in the art.
Figure 2:
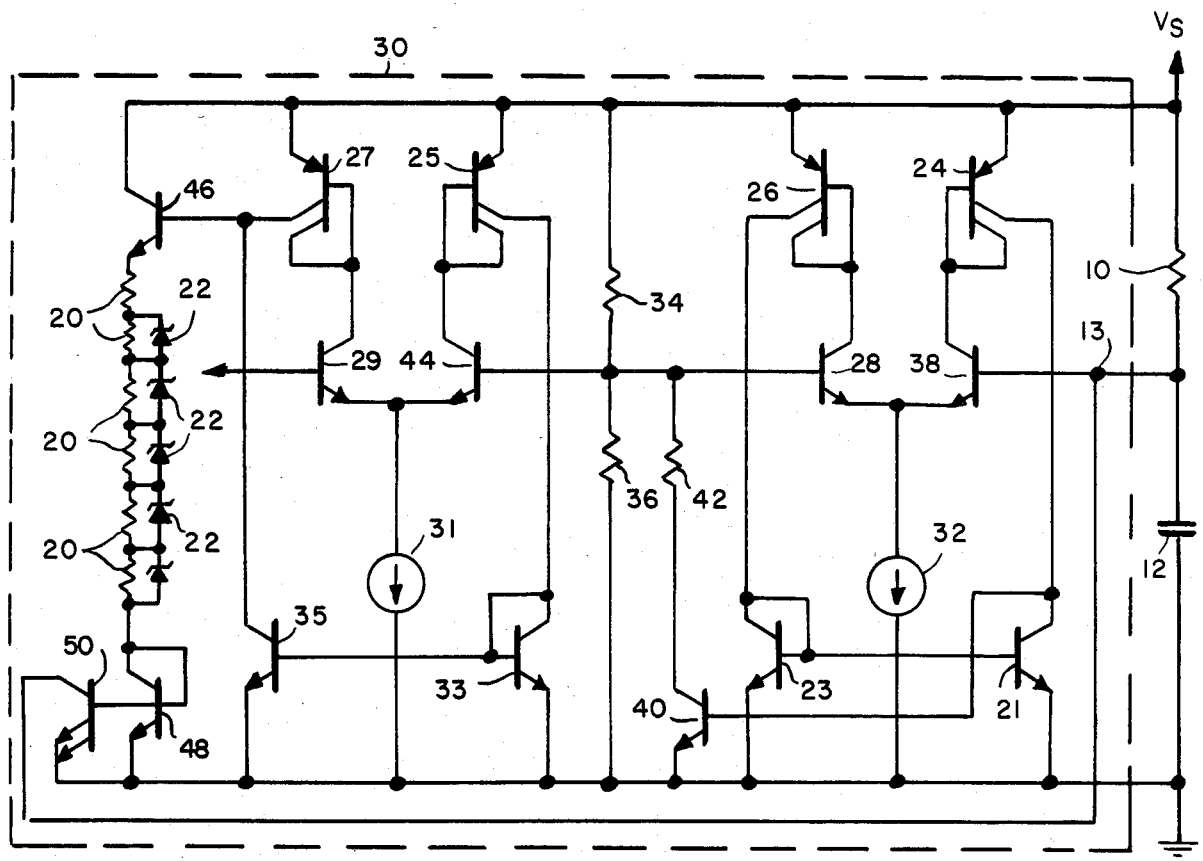
FIG. 2 is a schematic of an oscillator circuit using a first embodiment of the integrated circuit of the present invention.

Referring now to FIG. 2, a schematic diagram of an oscillator using an integrated circuit 30 of the present invention is shown. The integrated circuit 30 is connected to a charging resistor 10 and a timing capacitor 12 to form a complete oscillator. In accordance with the present invention, the discharging resistance is made with several different resistors 20 connected in series. A plurality of zener diodes 22 are connected in parallel with a plurality of the discharging resistors 20. Each zener diode 22 is connected in parallel with one of the discharge resistors 20. The resistors 20 have different values thereby allowing for coarse and fine adjustment of the discharge resistance through zener zapping.

Zener zapping is accomplished by applying a relatively large amount of current through appropriate zener diodes causing them to short out. At the wafer probe level, automatic test equipment measures the discharge current of each integrated circuit. While this measurement is being performed, metal probe needles in contact with resistors 20 are sequentially shorted together. When the discharge current is at the desired level, the appropriate zeners are zapped. In this manner, the discharge resistance is selected so that a predetermined discharge current will be produced in each of the oscillator integrated circuits despite the normal tolerances of the manufacturing process.

The operation of the circuit of FIG. 2 is as follows. At the start of a cycle, the timing capacitor 12 is charged through the charging resistor 10. Upper and lower limits for the voltage of the timing capacitor 12 at input 13 are set by resistors 34, 36 and 42 in combination with a switching transistor 40. The top voltage is set with transistor 40 off, by the voltage divider formed by transistor 34 and resistor 36. The comparator formed by transistor 28 and transistor 38 senses when the timing capacitor 12 reaches the top voltage determined by the voltage divider formed by resistor 34 and resistor 36. Then transistor 38 turns on. Current source 32 provides current for the comparator of transistor 28 and transistor 38. The current through transistor 28 or transistor 38 is turned around by current mirror 26 and current mirror 24 into the current mirror formed by transistors 21 and 23. Thus, when transistor 38 turns on, transistor 40 is turned on. This causes resistor 42 to be in parallel with resistor 36 changing the voltage limit to the lower limit.

After transistor 40 turns on, a second comparator formed by transistor 44 and transistor 29 will cause transistor 35 to turn off. Current source 31 provides current to the comparator of transistors 29 and 44. Current mirror 27, current mirror 25 turn the current from the comparator around and into the current mirror formed by transistor 35 and transistor 33. When transistor 35 is turned off, transistor 46 is switched on to allow current to flow through resistors 20 and transistor 48. Transistors 48 and 50 are arranged as a current mirror. This means transistor 50 acts as a current source whose current is determined by that in transistor 48. By providing transistor 50 with multiple emitters a multiplication factor is set. The current through transistor 50 is equal to the current through transistor 48 multiplied by the multiplication factor. Therefore, since the present invention provides a predetermined discharge current through tansistor 48, a predetermined current will be likewise produced in transistor 50. Transistor 50 thus discharges timing capacitor 12 at a predetermined rate with the predetermined current thereby achieving known and accurate timing.

When the lower limit is reached at the input terminal connected to the timing capacitor 12, the comparator of transistors 28 and 38 causes transistor 40 to turn off changing the limit to its upper value. The comparator formed by transistors 29 and 44 then causes turning off the discharge current.

Advantageously, the integrated circuit 30 of FIG. 2 is designed to compensate for the positive temperature coefficient of the discharging resistance. This is accomplished by the application of an equal and opposite temperature coefficient of the base-emitter voltages of transistors 46 and 48. The base-emitter voltage of each of these two transistors has a known negative temperature coefficient, cancelling the positive temperature coefficient of each of the discharge resistors 20.

The present invention may alternately be practiced by using zener zapping to adjust the multiplication factor in transistor 50. Rather than provide the zener diodes 22 in parallel with resistors 20, the diodes would be connected in series with a plurality of emitters in transistor 50. The emitters would have various values to allow for fine and coarse adjustment. The appropriate diodes would be shorted out to set the multiplication factor through transistor 50 such that the predetermined discharge current is produced in it when transistor 46 is switched on.

Figure 3:
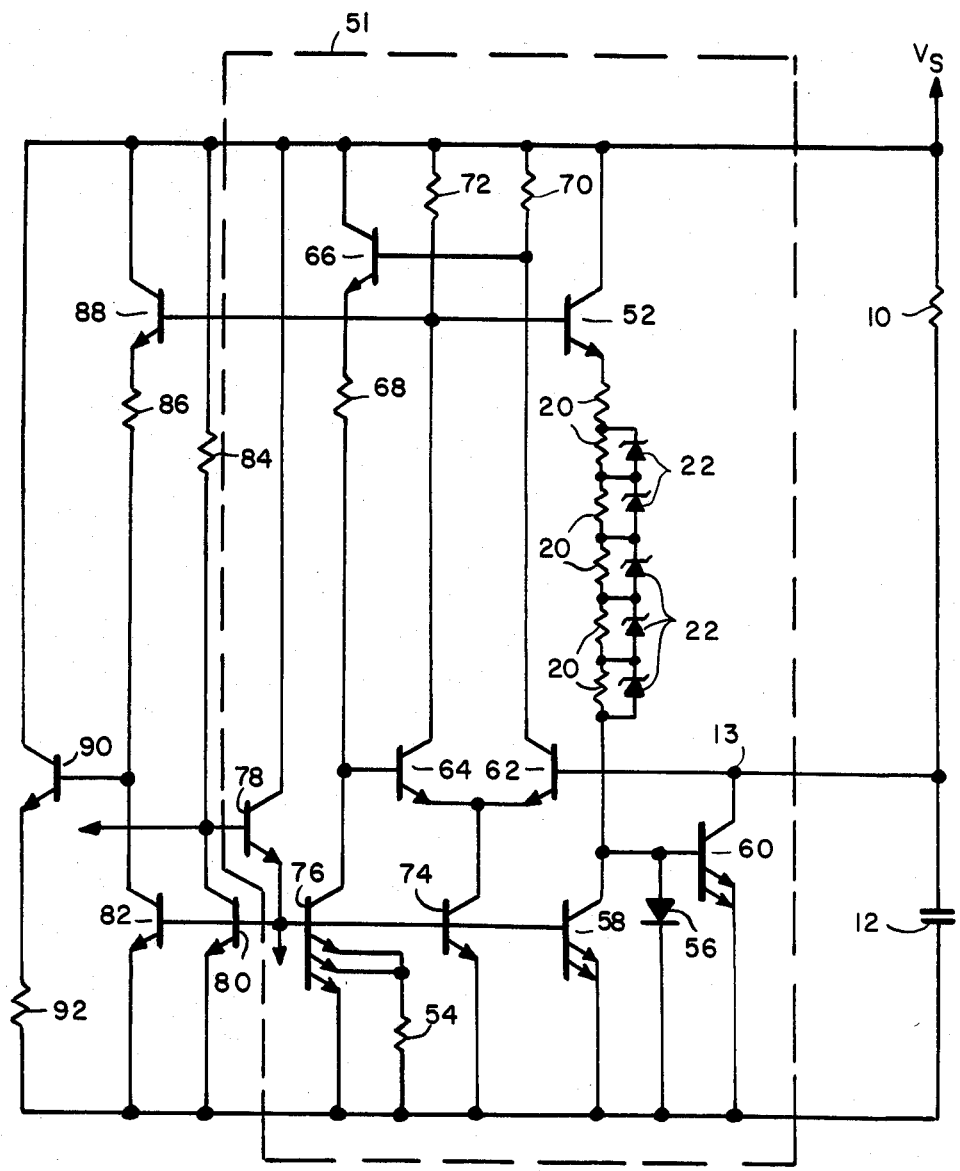
FIG. 3 is a schematic of an oscillator circuit using a second preferred embodiment of the integrated circuit of the present invention.

Referring now to FIG. 3, a preferred second embodiment of the invention is shown. The design of integrated circuit 51 as shown is essentially the same as that found in an integrated circuit manufactured under the identification numbers UC1842 by the Unitrode Corporation, Lexington, Massachusetts. The UC1842 is an unreliable oscillator integrated circuit when used in mass manufacture of triangular mode 50% duty cycle oscillators. Advantageously, the present invention may be used in this circuit to overcome the reliability problem. In accordance with the present invention, the discharge current is predeterminable through use of the zener zapping technique on the discharge resistors 20 or on the emitters of discharge transistor 60. Within integrated circuit 51 of FIG. 3, upper and lower limits for the voltage of the timing capacitor at input 13 are set by resistor 68 and transistor 66. When the voltage at the base of transistor 66 approximates Vs, the upper limit is monitored at the base of transistor 64. When the voltage at the base of transistor 66 is lowered by the voltage drop across resistor 70, the comparator formed by transistors 62 and 64 monitor the lower limit. Transistors 58, 74, 76, 78, 80 and 82 form constant current sources. Transistor 80 is a reference diode. The current flowing through transistor 80 is determined by resistor 84. Since transistors 74, 80 and 82 have common base/emitter connections, identical currents will flow through them. Transistors 76 and 58 have multiple emitters causing a multiplied current to flow therethrough. Resistor 54 affects the amount of current through transistor 76 and thus forms a part of that current source.

As the capacitor 12 starts charging via resistor 10, transistor 62 is off and transistor 64 is on. All of the current from current source 74 flows through transistor 64 and resistor 72. This causes a fixed voltage drop across resistor 72 and thus a known voltage at the base of transistor 52. This fixed voltage sets the current through resistors 20. This current is less than what is required by transistor 58 causing it to go to compliance. Hence, no current is available for diode 56 and discharge transistor 60. When transistor 62 is off, the base of transistor 66 is essentially at Vs. The upper voltage limit for input terminal 13 is thus set at Vs minus the base to emitter voltage of transistor 66 and minus the voltage drop across resistor 68 due to current source 76.

When the voltage of capacitor 12 reaches the upper limit, transistor 62 turns on and transistor 64 turns off. The current in transistor 74 now flows through transistor 62 and not transistor 64. The voltage at the base of transistor 66 drops due to the voltage drop across resistor 70. This shifts the voltage at the base of transistor 64 a corresponding amount to establish a lower limit for input terminal 13.

With transistor 64 not conducting, the voltage at the base of transistor 52 is at Vs. This higher voltage causes additional current through resistors 20. The total current now is Vs minus the base emitter voltages across transistor 52 and diode 56 divided by the resistance of resistors 20. This current exceeds that which can be sinked through transistor 58 by an amount which was predetermined when the resistance of resistors 20 was set through the zener zapping process. That predetermined current flows through diode 56 and a multiple of that current determined by the multiplication factor of discharge transistor 60 flows through discharge transistor 60. In the presently preferred embodiment, discharge transistor 60 has 16 emitters, thus 16 times the current flowing through diode 56 will flow through 60. The discharge current is predetermined by zener zapping to obtain a predetermined current through diode 56 that produces the desired discharge current in discharge transistor 60. Capacitor 12 is discharged by the current through transistor 60.

Figure 4:
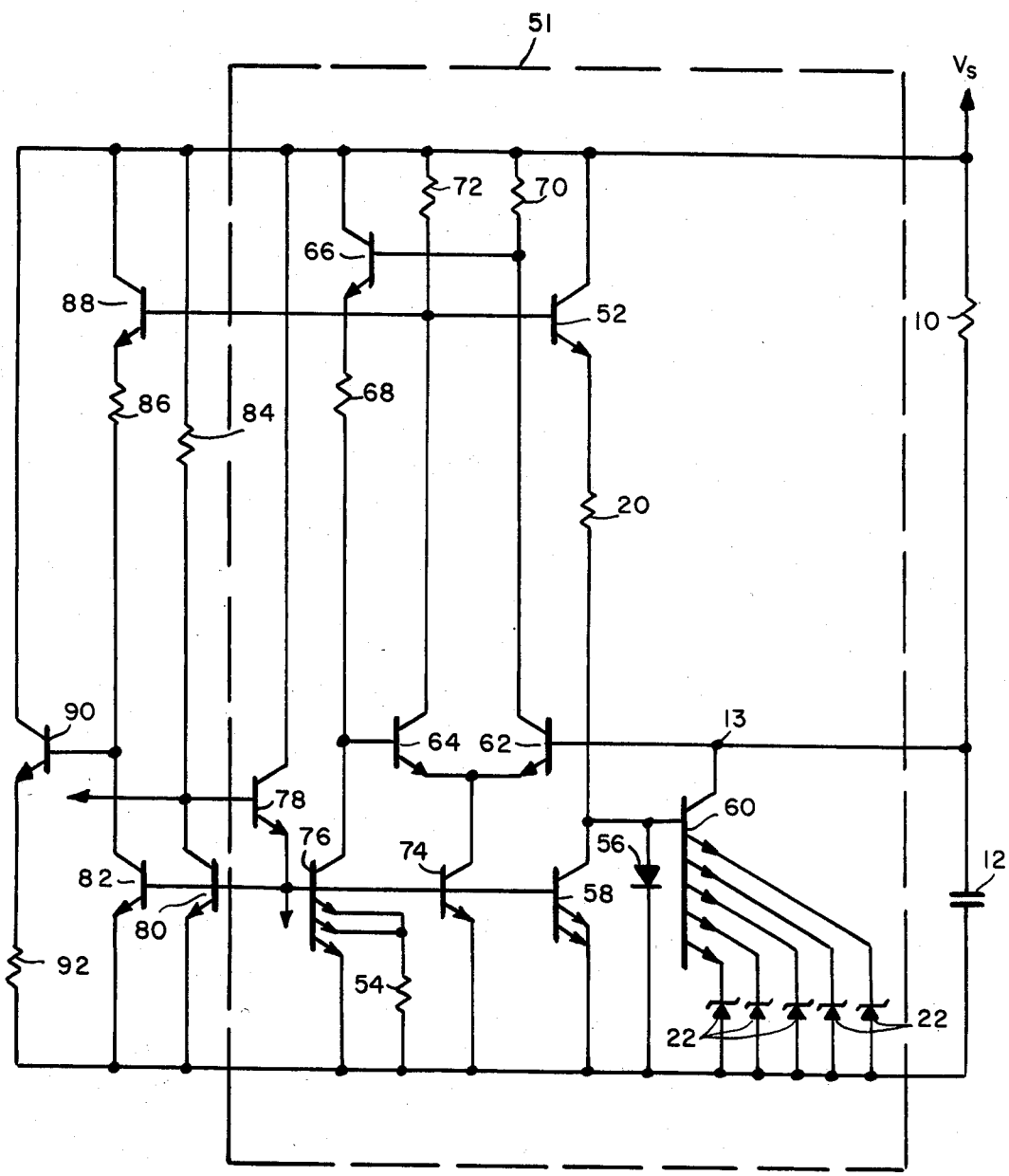
FIG. 4 is a schematic of an oscillator circuit using a third preferred embodiment of the integrated circuit of the present invention.

When the voltage of the capacitor 12 at terminal 13 reaches the lower limit now at the base of transistor 64, then transistor 62 will turn off and transistor 64 will turn on and the cycle repeats. A buffer stage is attached to the end of the oscillator integrated circuit 51. The buffer stage is formed by transistor 88, resistor 86, current source 82, transistor 90 and resistor 92. The invention may be equally accomplished by using the zener zapping technique as shown in FIG. 4, on the emitters of transistor 60 instead of the resistors 20. Zapping in either location can produce a predetermined discharge current.

Though the embodiments hereinbefore described are preferred, many modifications and refinements which do not depart from the true spirit and scope of the invention may be conceived by those skilled in the art. It is intended that all such modifications, including but not limited to those set forth above, be covered by the following claims:

We claim:

1. An oscillator integrated circuit comprising:
   means for providing a first predetermined current, said current providing means including a plurality of resistors connected in series and a plurality of zener diodes, each of said diodes connected in parallel with one of said plurality of resistors, one or more of said diodes being shorted out so that said first predetermined current is provided;
   electronic component means for carrying said first predetermined current received from said current providing means;
   a discharge transistor having a multiplication factor and connected to said electronic component means so that a second predetermined current flows through said discharge transistor equal to said first predetermined current times said multiplication factor;
   an input terminal having an input voltage;
   comparator means for producing a first switch signal when said input voltage equals either an upper or a lower limit;
   means for setting said upper and lower limits; and
   means for switching said first predetermined current on or off in response to said first switch signal.

2. The integrated circuit of claim 1 wherein said electronic component means comprises a transistor that forms a current mirror with said discharge transistor.

3. The integrated circuit of claim 1 wherein said electronic component means comprises a diode.

4. The integrated circuit of claim 1 wherein said means for setting said upper and lower limits comprises a voltage divider and said integrated circuit further comprises a second comparator means for producing a second switch signal prior to said first switch signal when said input voltage equals either an upper or a lower predetermined limit; and
   means for switching a resistance on a side of said voltage divider in response to said second switch signal to change the predetermined limit from one to the other.

5. The integrated circuit of claim 1 wherein said plurality of resistors have a temperature coefficient equal and opposite to the temperature coefficient of said switching means and said electronic component means so that said first predetermined current is substantially unaffected by temperature changes.

6. The integrated circuit of claim 1 wherein said means for setting said upper and lower limits comprises a transistor and a resistance connected in series with said transistor and means for switching the base voltage of said transistor between a first voltage and a second voltage.

7. The integrated circuit of claim 1 wherein said current providing means further includes a current sink which sinks all of the current from said plurality of resistors when said switching means switches said first predetermined current off and sinks all but said first predetermined current from said plurality of resistors when said switching means switches said first predetermined current on.

8. An oscillator integrated circuit comprising:
   means for providing a first current;
   electronic component means for carrying said first current received from said current providing means;
   a discharge transistor having a plurality of emitters and a multiplication factor set by said emitters, said discharge transistor being connected to said electronic component means so that a current flows through said discharge transistor which is equal to said first current times said multiplication factor;
   a plurality of zener diodes, each of said diodes connected in series with one of said emitters, one or more of said diodes being shorted out to adjust said multiplication factor so that the current that flows through said discharge transistor is a predetermined current;
   an input terminal having an input voltage;
   comparator means for producing a first switch signal when said input voltage equals either an upper or a lower limit;
   means for setting said upper and lower limits; and
   means for switching said first current on or off in response to said first switch signal.

9. The integrated circuit of claim 8 wherein said electronic component means comprises a transistor that forms a current mirror with said discharge transistor.

10. The integrated circuit of claim 8 wherein said electronic component means comprises a diode.

11. The integrated circuit of claim 8 wherein said means for setting said upper and lower limits comprises a voltage divider and said integrated circuit further comprises a second comparator means for producing a second switch signal prior to said first switch signal when said input voltage equals either an upper or a lower predetermined limit; and
   means for switching a resistance on a side of said voltage divider in response to said second switch signal to change the predetermined limit from one to the other.

12. The interated circuit of claim 8 wherein said means for setting said upper and lower limits comprises a transistor and a resistance connected in series with said transistor and means for switching the base voltage of said transistor between a first voltage and a second voltage.

13. The integrated circuit of claim 8 wherein said current providing means provides current through a resistor and further includes a current sink which sinks all of the current coming through said resistor when said switching means switches said first current off and sinks all but said first current coming through said resistor when said switching means switches said first current on.

* * * * *

UNITED STATES PATENT AND TRADEMARK OFFICE
CERTIFICATE OF CORRECTION

PATENT NO. : 4,670,721

DATED : June 2, 1987

INVENTOR(S) : Walter S. Gontowski, Jr., John G. Metro, Steven S. Yole

It is certified that error appears in the above-identified patent and that said Letters Patent is hereby corrected as shown below:

Column 3 - line 11:

delete "transistor 34", insert --resistor 34--

Signed and Sealed this

Nineteenth Day of January, 1988

Attest:

DONALD J. QUIGG

Attesting Officer

Commissioner of Patents and Trademarks